(12) United States Patent
Lautzenhiser et al.

(10) Patent No.: US 9,976,406 B2
(45) Date of Patent: May 22, 2018

(54) ENHANCED BANDWIDTH TRANSDUCER METHOD FOR WELL INTEGRITY MEASUREMENT

(71) Applicant: Piezotech LLC, Indianapolis, IN (US)

(72) Inventors: Frans Lautzenhiser, Zionsville, IN (US); Mahesh Matam, Zionsville, IN (US); Patrick Gwin, Indianapolis, IN (US)

(73) Assignee: Piezotech LLC, Indianapolis, IN (US)

( * ) Notice: Subject to any disclaimer, the term of this patent is extended or adjusted under 35 U.S.C. 154(b) by 501 days.

(21) Appl. No.: 14/794,006

(22) Filed: Jul. 8, 2015

(65) Prior Publication Data

US 2015/0322768 A1    Nov. 12, 2015

Related U.S. Application Data

(63) Continuation of application No. 13/713,839, filed on Dec. 13, 2012, now Pat. No. 9,105,836.

(Continued)

(51) Int. Cl.

| | |
|---|---|
| *H01L 41/09* | (2006.01) |
| *G10K 11/00* | (2006.01) |
| *E21B 47/00* | (2012.01) |
| *H01L 41/083* | (2006.01) |
| *G01B 17/02* | (2006.01) |
| *H04B 11/00* | (2006.01) |
| *B06B 1/06* | (2006.01) |
| *E21B 47/09* | (2012.01) |
| *E21B 47/16* | (2006.01) |

(52) U.S. Cl.
CPC ............ *E21B 47/00* (2013.01); *B06B 1/0614* (2013.01); *E21B 47/0005* (2013.01);
(Continued)

(58) Field of Classification Search
CPC .... E21B 47/00; E21B 47/0005; E21B 47/091; E21B 47/16; B06B 1/0614; H01L 41/083; H01L 41/09; H04B 11/00
(Continued)

(56) References Cited

U.S. PATENT DOCUMENTS

| | | |
|---|---|---|
| 3,872,330 A | 3/1975 | Miller et al. |
| 5,410,205 A | 4/1995 | Gururaja |

(Continued)

FOREIGN PATENT DOCUMENTS

| | | |
|---|---|---|
| JP | 77011926 | 1/1977 |
| JP | 200023295 A | 8/2001 |

*Primary Examiner* — Thomas Dougherty
(74) *Attorney, Agent, or Firm* — Blank Rome LLP

(57) ABSTRACT

A single critically damped acoustic stack yields a wide frequency range as an acoustic transmitter or as an acoustic transducer having particular use in well integrity determination. The critically damped present acoustic stack utilizes a plurality of stacked acoustic elements such as piezoelectric ceramics that are energized in two manners, providing different center frequencies, each producing a respective center frequency of 100% bandwidth to yield an acoustic stack having a total bandwidth exceeding the bandwidth of an acoustic element or the bandwidth of the plurality of acoustic elements. One manner of energizing is to pulse only one of the acoustic elements. The other manner is to pulse a first acoustic element then pulse a second acoustic element after a delay equal to the amount of time it takes for the first pulse to reach the face of the second acoustic element. The acoustic stack is primarily used in pulse-echo analysis of metal casing wall thickness and cement bond quality detection of wells.

16 Claims, 15 Drawing Sheets

Related U.S. Application Data

(60) Provisional application No. 61/569,872, filed on Dec. 13, 2011.

(52) U.S. Cl.
CPC ............ *E21B 47/091* (2013.01); *E21B 47/16* (2013.01); *G01B 17/02* (2013.01); *H01L 41/083* (2013.01); *H01L 41/09* (2013.01); *H04B 11/00* (2013.01)

(58) Field of Classification Search
USPC ........ 310/317, 320–322, 326, 327, 334, 366
See application file for complete search history.

(56) References Cited

U.S. PATENT DOCUMENTS

| | | | | |
|---|---|---|---|---|
| 6,132,374 | A * | 10/2000 | Hossack | A61B 8/00 600/443 |
| 6,193,659 | B1 * | 2/2001 | Ramamurthy | A61B 8/481 600/443 |
| 6,466,513 | B1 * | 10/2002 | Pabon | B06B 1/067 181/105 |
| 6,552,471 | B1 * | 4/2003 | Chandran | B06B 1/0611 310/328 |
| 9,050,628 | B2 * | 6/2015 | Lautzenhiser | E21B 47/101 |
| 9,105,836 | B2 * | 8/2015 | Matam | H01L 41/083 |
| 9,142,752 | B2 * | 9/2015 | Lautzenhiser | H01L 41/04 |
| 9,537,582 | B2 * | 1/2017 | Ngo | H04B 11/00 |
| 2005/0000279 | A1 * | 1/2005 | Yogeswaren | B06B 1/0622 73/152.58 |

* cited by examiner

ENHANCED BANDWIDTH TRANSDUCER METHOD FOR WELL INTEGRITY MEASUREMENT

CROSS-REFERENCE TO RELATED APPLICATIONS

This application is a continuation of U.S. application Ser. No. 13/713,839, filed Dec. 13, 2012, which claims the benefit of U.S. Provisional App. No. 61/569,872 filed Dec. 13, 2011, the entire contents of which are specifically incorporated herein by reference.

FIELD OF THE INVENTION

The present invention relates to the field of acoustic measurement methods and devices and, more particularly, but not exclusively, to methods and devices for measuring well integrity.

BACKGROUND

During formation of a well, a hole is drilled in the earth and a metal casing is inserted into the hole. After the metal casing is in place, cement is used to fill in the area between the metal casing and the wall of the hole. It is important for the integrity of the well that the cement properly cure, create a solid bond between the outside of the metal casing and the wall of the hole, and be free of voids and/or air pockets— together known as cement bond quality. If there is a problem with cement bond quality, the integrity of the well may be compromised and the problem must be fixed.

Moreover, during the life of the well, problems such as deterioration of the cement bond quality as well as with the metal casing may cause the integrity of the well to be compromised. It is therefore crucial to periodically determine well integrity by taking non-destructive measurements within the well for determination of well integrity.

As explained above, after the well hole is bored a metal casing or tube is placed into the well hole. The deeper the well the thicker the metal casing needs to be. Thickness of the metal casing thus depends upon its depth. Metal casing thickness can range from one quarter inch (¼") to one and one quarter inches (1¼") for shallow to deep wells.

While current technology provides various manners of non-destructive determining of well integrity, pressure and temperature considerations, particularly in deep wells (e.g. −180° C. and 20,000 psi), limits the type of technology utilized both functionally and economically. Therefore, non-destructive acoustic technology is preferred for well integrity determination. Acoustic technology utilizes an acoustic signal that is emitted outwardly from an acoustic transmitter or transducer (element) toward the metal casing, the acoustic element typically a piezoelectric element. An acoustic receiver or the transducer, again typically a piezoelectric element, receives acoustic signals that reflect from the metal casing, the cement and/or area behind the metal casing, and the well wall. The received acoustic signals are then analyzed to determine metal casing integrity and cement bond quality, i.e. well integrity.

In order to obtain meaningful data for well integrity determination, it is important that the emitted acoustic signal be at the resonant frequency of the metal casing. For metal casings of between one quarter inch (¼") and one and one quarter inches (1¼") thick, the resonant frequency is between 250 kHz and 500 kHz (see FIG. 9). Because a single piezoelectric transducer has a small bandwidth, it is necessary to have multiple piezoelectric transducers so as to cover the large 250 kHz to 500 kHz bandwidth. Therefore, in order to try and cover this large bandwidth, well integrity tools currently have multiple, single-element piezoelectric transducers each of a different frequency. However, because of space and cost considerations of well tools the number of piezoelectric transducers is limited. As such, current well tools do not have the capability to cover the large bandwidth necessary to perform well integrity analysis on a sizable range of metal casing thicknesses.

What is therefore needed is a compact single acoustic device that covers a large bandwidth particularly, but not necessarily for well integrity measurements.

SUMMARY OF THE INVENTION

Disclosed herein is a single critically damped acoustic transmitter allowing for both an acoustic transmitter and an acoustic transducer that yields a wide frequency range used particularly, but not necessarily, for detection of pipe wall thickness and cement bond quality in downhole applications.

The present single critically damped acoustic transmitter utilizes a plurality of stacked acoustic elements which when operated together and singularly, provide different center frequencies each producing a respective center frequency of 100% bandwidth thereby yielding an acoustic transmitter having a total bandwidth far exceeding the bandwidth of each individual acoustic element or the bandwidth of just the plurality of acoustic elements.

The acoustic elements are preferably, but not necessarily, piezoelectric elements such as piezoelectric ceramics. The piezoelectric ceramics are bonded together and onto a backing that highly dampen or attenuate acoustic signals (at least a 15 MRyl impedance) to form a critically damped acoustic transmitter. The assembly is retained in a housing that is preferably, but not necessarily, made of polyetheretherketone (PEEK). The PEEK housing preferably, but not necessarily, is a 30% glass filled PEEK housing.

In one form, the critically damped acoustic transmitter has two stacked and bonded piezoelectric ceramics of the same center frequency mounted to a tungsten backing within a PEEK housing.

A first positive lead is connected to a side of a first piezoelectric ceramic of the stacked piezoelectric ceramics that is bonded to the tungsten backing, while a second positive lead is connected to a side of a second piezoelectric ceramic of the stacked piezoelectric ceramics. A common negative lead is situated at the interface between the first and second piezoelectric ceramics. This connection scheme allows a large bandwidth to be achieved. The two piezoelectric ceramics are energized in two manners.

One manner is where the first and second piezoelectric ceramics are pulsed on a slight delay relative to one another, with a first piezoelectric ceramic (adjacent the backing) pulsed first and the second piezoelectric ceramic pulsed when the acoustic pulse from the first piezoelectric ceramic reaches the face of the second piezoelectric ceramic, which together produce a first bandwidth equal to one-half (½) of the center frequency of the first and second piezoelectric ceramics. Another manner is where one of the first and second (and preferably the first) piezoelectric ceramics is fired separately to produce a second bandwidth of its center frequency. The first and second bandwidths together provide an overall large bandwidth.

For downhole metal casing and cement bond quality determination wherein the metal casing typically has a thickness of between a quarter inch (¼") and one and one quarter inches (1¼") thick, the two piezoelectric ceramic transmitters each have a 500 kHz center frequency. The first bandwidth (i.e. the two piezoelectric ceramic transmitters energized together) has a 250 kHz center frequency, while the second bandwidth (i.e. the first piezoelectric ceramic transmitter energized separately) has a 500 kHz center frequency. With a 100% bandwidth for the first and second bandwidths, a 100 kHz to 750 kHz bandwidth is achieved.

In another form, the critically damped acoustic transmitter has four stacked and bonded piezoelectric ceramics of the same center frequency mounted to a tungsten backing within a PEEK housing. In this form, the polarity of adjacent elements is reversed to minimize voltage when multiple elements are driven simultaneously.

In this form, the four elements may be driven individually but sequentially, in pairs, or together sequentially. This connection scheme allows a large bandwidth to be achieved.

DETAILED DESCRIPTION

Figure 1:
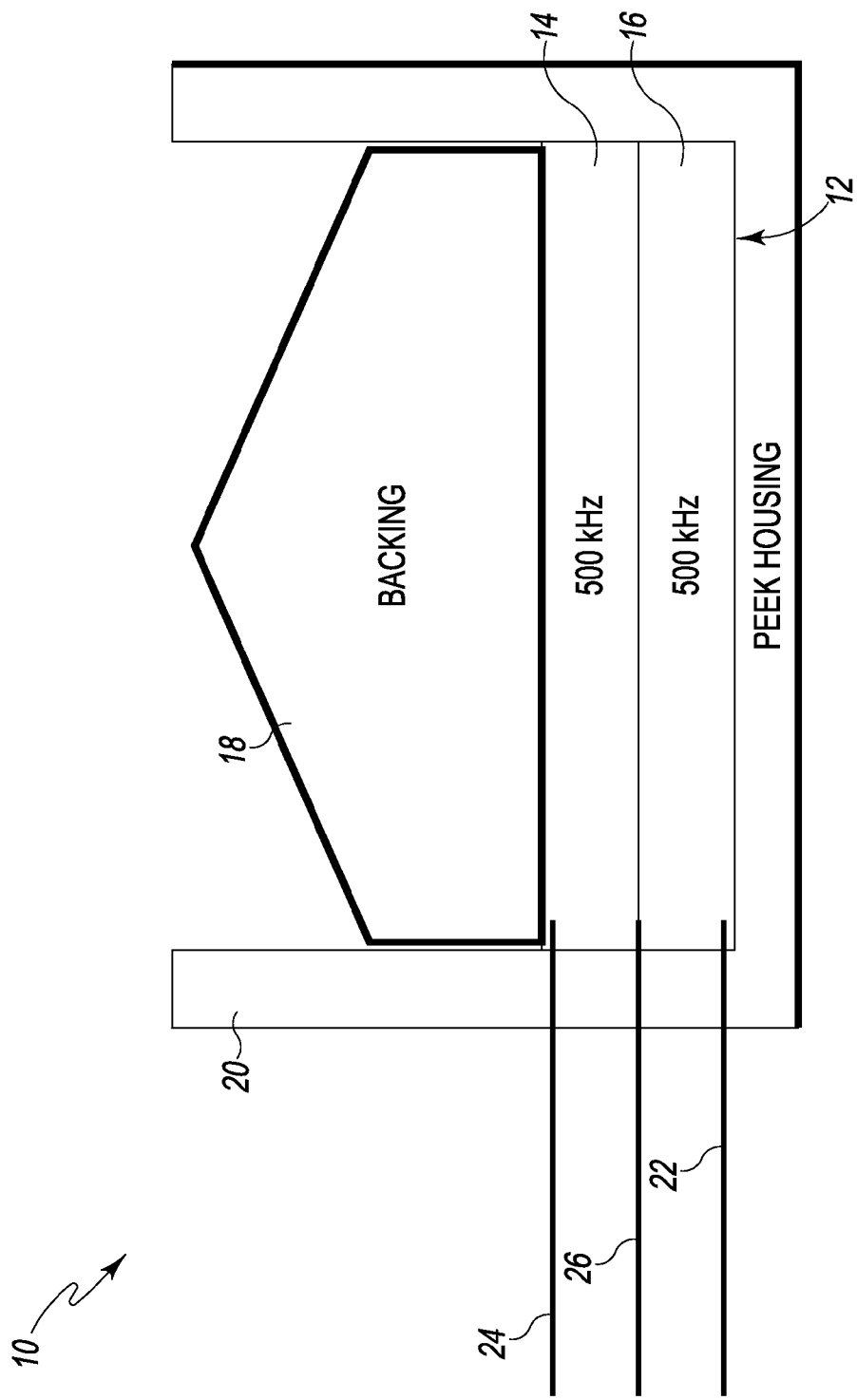
FIG. 1 is a depiction of an embodiment of a critically damped acoustic transducer according to the present principles.

Referring to FIG. 1, there is depicted a critically damped acoustic transducer ("acoustic transducer"), generally designated 10, fashioned in accordance with the present principles. The acoustic transducer 10 has an acoustic stack 12 having two (arbitrarily, first and second) acoustic elements 14, 16. It should be appreciated that while only two acoustic elements are shown, the acoustic stack 12 may consist of two or more (i.e. a plurality) of acoustic elements. The acoustic elements are preferably piezoelectric ceramics, however, other types of acoustic elements may be used. The acoustic stack 12 may be fashioned as an acoustic transducer or as only an acoustic transmitter depending on its electrical connection. Thus, description of the acoustic stack 12 and its components are applicable to the embodiment as a transducer 10 or as an acoustic transmitter except as indicated.

The acoustic elements 14, 16 are bonded to each other while the acoustic stack 12 is mounted to a highly acoustically absorbing or attenuating backing 18 (i.e. an impedance of 15 to 25 MRyls) all of which are disposed in a housing 20. Particularly a rear face of the (first) acoustic element 14 is mounted to a front face of the backing 18 preferably, but not necessarily, by epoxy. A rear face of the (second) acoustic element 16 is bonded to a front face of the first acoustic element 14 preferably, but not necessarily by epoxy. The backing 18 is preferably, but not necessarily, made of tungsten while the housing 20 is preferably, but not necessarily, made of PEEK. Other suitable materials however may be used for the backing 18 and the housing 12. With a PEEK housing, it was experimentally determined that a housing face thickness of 0.048" (1.22 mm) is a one-eighth wavelength ($\lambda/8$) at 250 kHz and a one-quarter wavelength ($\lambda/4$) at 500 kHz providing optimum wavelength transmission. The housing 12 is retained in a downhole tool (not shown) having an opening to receive the acoustic transducer 10 such that an acoustic signal from the acoustic stack 12 can be emitted from the bottom of the housing 12 toward a pipe casing or wall.

In both cases as an acoustic transducer and an acoustic transmitter only, a positive connection 22 is attached to the second acoustic element 16 preferably at a front face or area (proximate the housing 20) thereof Additionally, a positive connection 24 is attached to the first acoustic element 14 preferably at a rear face or area (proximate the backing 18) thereof Moreover, A a negative lead 26 common to both the first and second acoustic elements 14, 16 is connected between or at the interface of the first and second acoustic elements 14, 16 (i.e. on a front face or area of the first acoustic element 14 and a rear face or area of the second acoustic element 16).

In the acoustic transmitter only embodiment, the positive connections 22, 24 and the negative connection 26 are electrically connected (connectable) to additional circuitry (not shown) so as to only transmit an acoustic signal from the acoustic stack 12. This embodiment would require a separate acoustic receiver (not shown) for acquiring acoustic echo and reverberation signals in order to perform signal analysis and thus well integrity analysis. In the acoustic transducer embodiment, the positive connections 22, 24 and the negative connection 26 are electrically connected (connectable) to additional circuitry (not shown) so as to transmit and receive acoustic signals. This embodiment would not require a separate acoustic receiver in order to acquire acoustic echo and reverberation signals in order to perform signal analysis and thus well integrity analysis.

The first and second acoustic elements 14, 16 are preferably, but not necessarily, piezoelectric elements and, more particularly, piezoelectric ceramics. As shown, the first and second acoustic elements 14, 16 have the same center frequency. Utilizing acoustic elements of the same center frequency provides the most robust transmitted acoustic signal. With of two 500 kHz acoustic elements, the 100 kHz to 750 kHz bandwidth is covered. This is particularly suited for well integrity applications. However, to cover other bandwidths for the same or other applications, the first and second acoustic elements 14, 16 may each have the same center frequency but be different than 500 kHz. Additionally, the center frequencies of the two acoustic elements may be different depending on the desired bandwidth. It should be appreciated that the above principles with respect to two acoustic elements applies to a plurality of acoustic elements.

Referring to FIG. 1, the first and second acoustic elements 14, 16 are connected/connectable so as to be able to energize only one acoustic element (and preferably the first acoustic element 14) as well as energize both acoustic elements 14, 16. When only one acoustic element is energized, a 500 kHz acoustic signal is provided. When both acoustic elements are connected a 250 kHz acoustic signal is provided and thus in parallel (i.e. the positive leads 22 and 24 connected in parallel) with the negative lead 26 common to both. This allows the manipulation of the operating frequency to obtain a large bandwidth.

Figure 2:
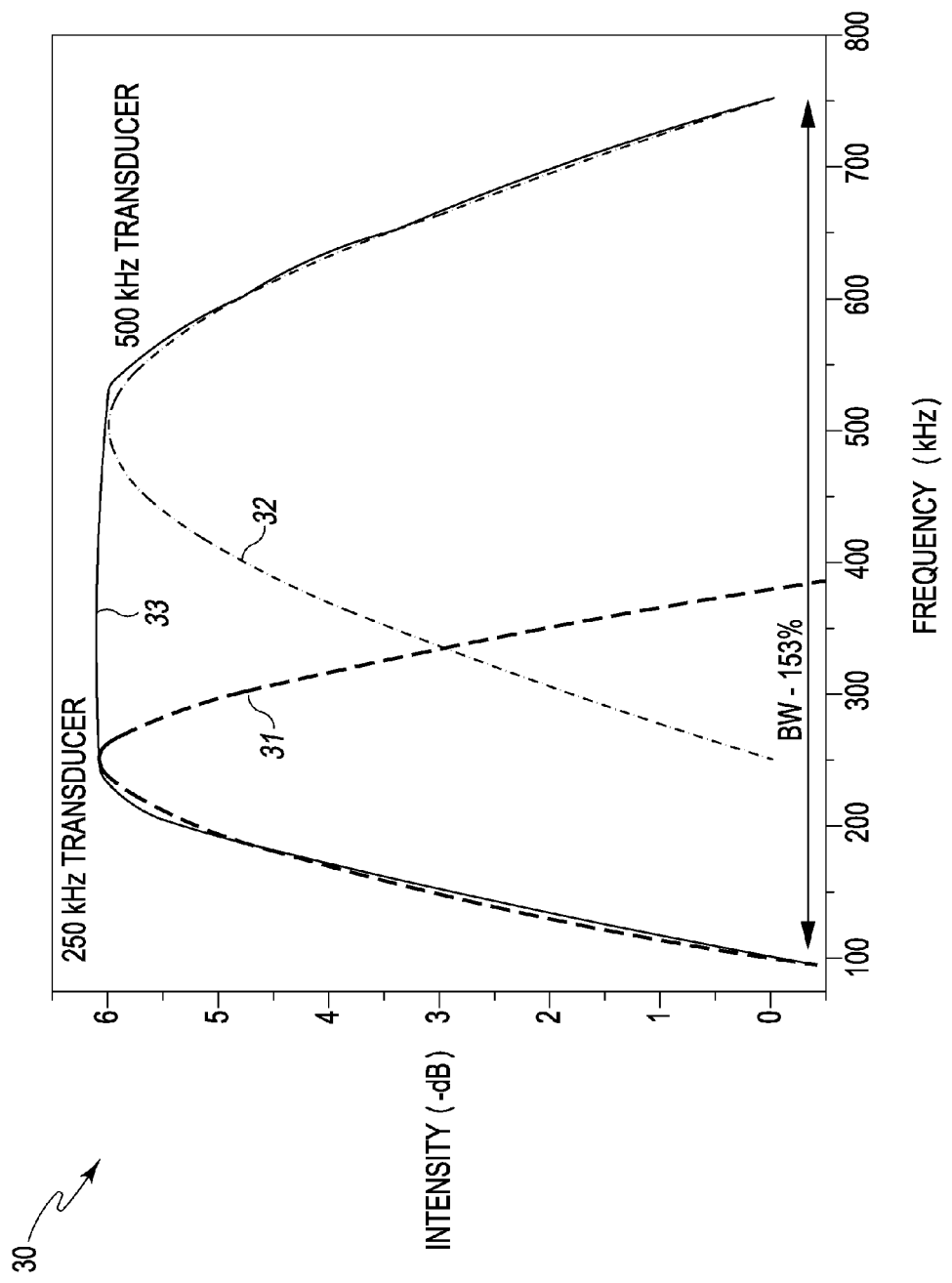
FIG. 2 is a Fast Fourier Transform (FFT) graph of the critically damped acoustic transducer of FIG. 1 energized in both a singular mode and a dual mode.

A large bandwidth is achieved by a two-fold process. One is to energize or fire the first and second acoustic elements 14, 16 with a slight delay with respect to one another. Particularly, the first acoustic element (the acoustic element closest to the backing 18) is fired first. After a time delay, the second acoustic element 16 (furthest from the backing 18) is energized or fired. The timing of the delay in firing the second acoustic element 16 is calculated so that it fires when the acoustic pulse or wave emitted from the first acoustic element 14 reaches the front face of the second acoustic element. In determining the time delay, the speed of sound through the second acoustic element 16 and the width of the second acoustic element 16 must be taken into consideration. By energizing or firing the second acoustic element 16 when the acoustic pulse or wave emitted from the first acoustic element 14 reaches the face of the second acoustic element 16, a large acoustic spike is created. As the FFT (FIG. 2) of the acoustic spike shows, the acoustic spike contains a greater frequency spectrum. Both acoustic elements 14, 16 emit an acoustic signal or pulse (and in the case of piezoelectric ceramics an ultrasonic signal or pulse) which together creates a large spike to achieve a center frequency around 250 kHz. The bandwidth achieved depends on how quickly and strongly the acoustic signal travels towards and into the backing 18 and is dissipated. If a 100% bandwidth is achieved, the frequency range of the acoustic stack 12 is about 100 kHz to 300 kHz (see the FFT graph of FIG. 2). This thus obtains a lower bandwidth than the center frequency of the individual acoustic elements.

Another is to energize only one of the acoustic elements 14, 16. However, from experimental research, maximum bandwidth is achieved only with energizing of the first acoustic element 14. Therefore, the lead 24 only is connected to positive while the lead 26 is connected to negative. The acoustic element 14 emits an acoustic signal or pulse (and in the case of a piezoelectric ceramic an ultrasonic signal or pulse) which achieves a center frequency of 500 kHz. Again, the bandwidth achieved depends on how quickly and strongly the acoustic signal travels towards and into the backing 18 and is dissipated. If a 100% bandwidth is achieved, the frequency range of the single acoustic element 14 is about 250 kHz to 750 kHz (see the FFT graph 30 of FIG. 2 where curve 32 is a single 500 kHz bandwidth, curve 31 is the dual element 250 kHz bandwidth, and curve 33 is the combined bandwidth). This two-fold manner thus obtains a higher bandwidth than the center frequency of stacked acoustic elements. The bottom acoustic element 16 in this case acts only as an acoustic medium since it is not connected electrically. Since the acoustic impedance of the two acoustic elements 14, 16 are the same, the bottom acoustic element 16 just lets the acoustic wave pass through.

Figure 3:
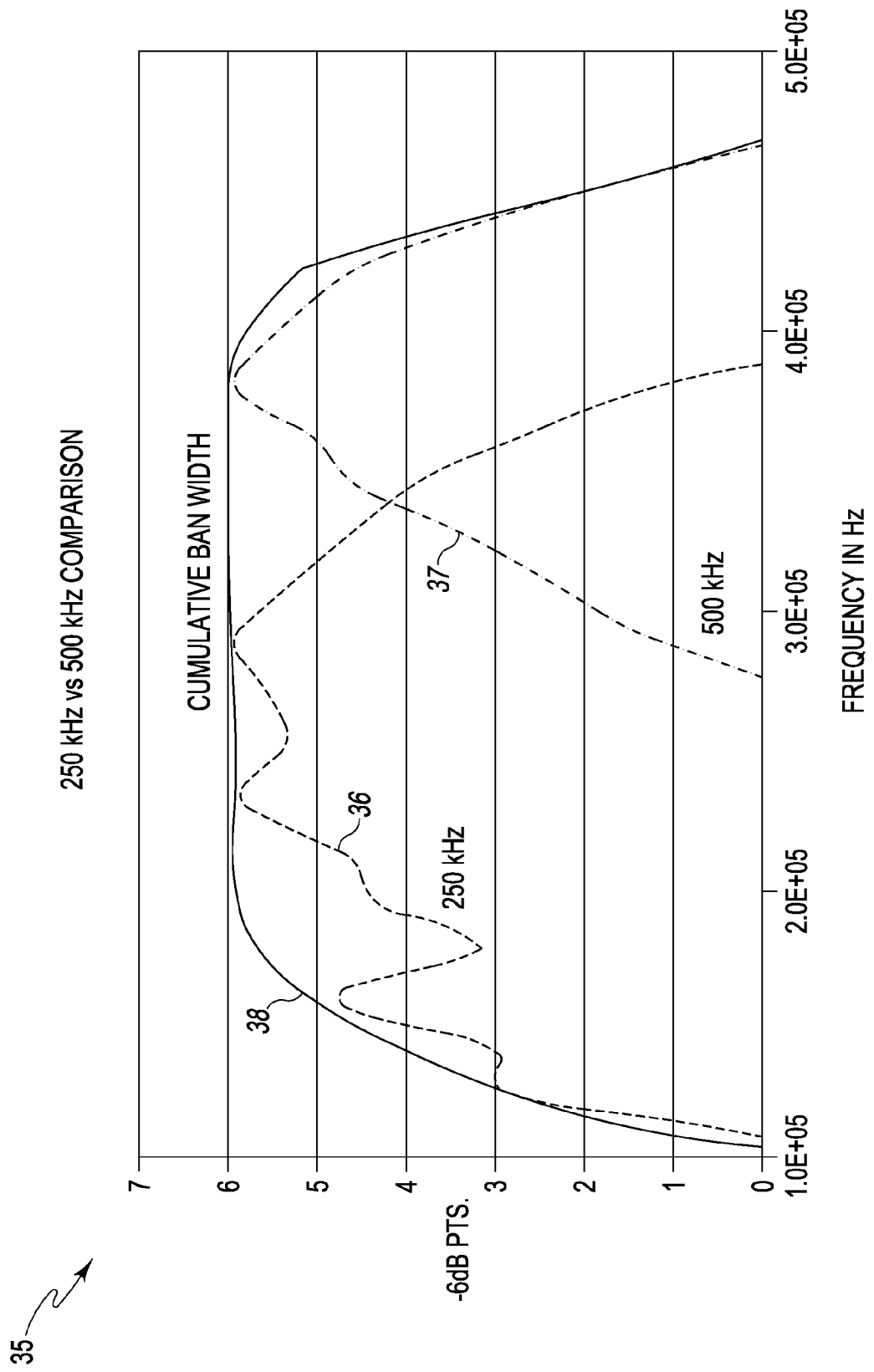
FIG. 3 is a bandwidth comparison graph of a transmitted 250 kHz acoustic signal versus a transmitted 500 kHz acoustic signal, as provided by the critically damped acoustic transducer of FIG. 1.
Figure 4:
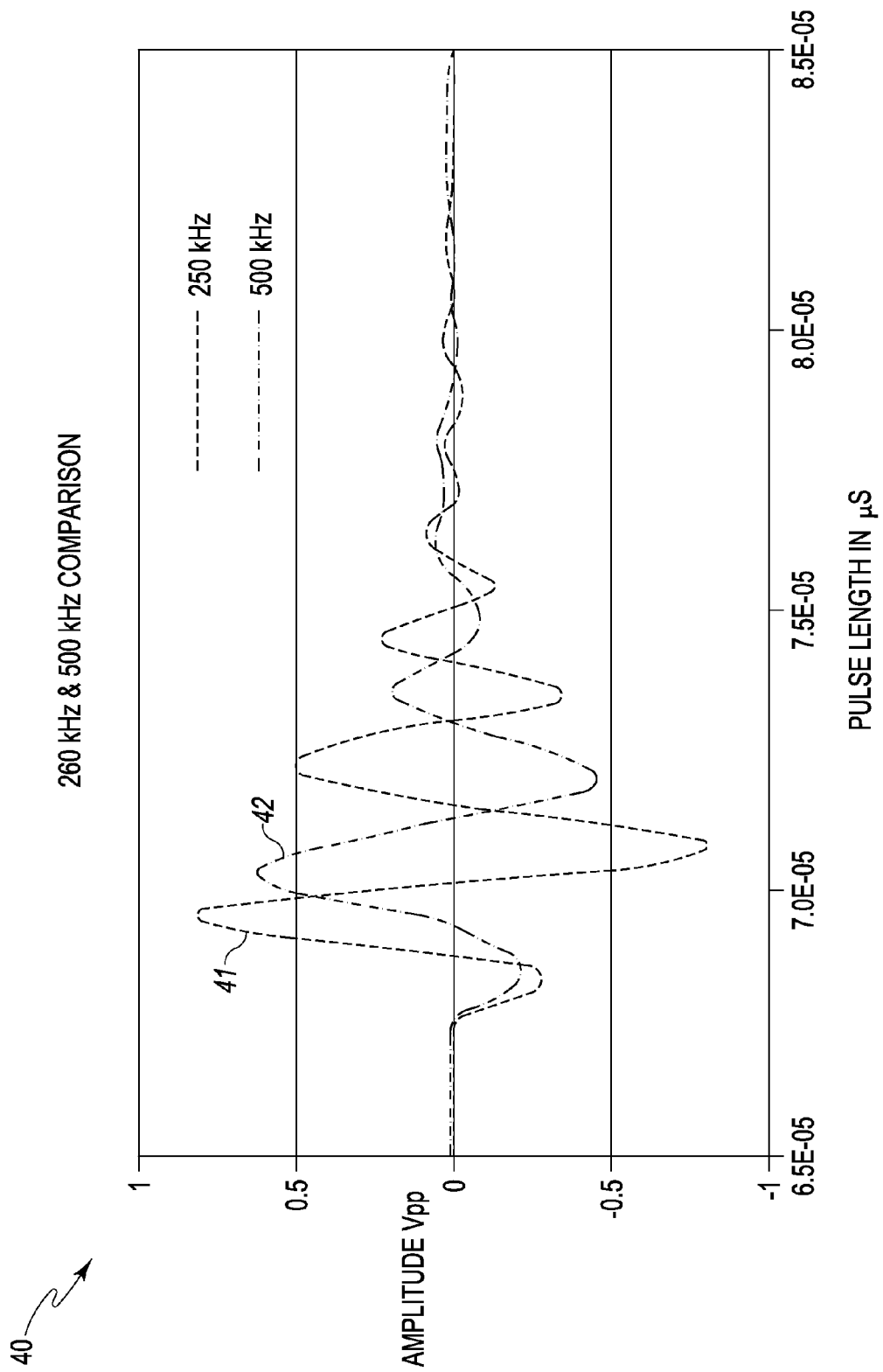
FIG. 4 is return signal sensitivity graph for a 250 kHz acoustic signal versus a 500 kHz acoustic signal as provided by the critically damped acoustic transducer of FIG. 1.

Combining the one manner or process of energizing the acoustic transducer 10 with the other manner or process of energizing the acoustic transducer 10 achieves a bandwidth ranging from frequencies as low as 100 kHz up to 500 kHz (see the graph 35 FIG. 3 where curve 36 is the 250 kHz bandwidth, curve 37 is the 500 kHz bandwidth, and curve 38 is the cumulative bandwidth) using two 500 kHz piezoelectric ceramics. In a well integrity analysis, since the thickness of the metal casing or pipe that is being analyzed is known, one or the other energizing process of the acoustic transducer 10 (as outlined above) is used in order that the proper frequency is emitted. In cases where the thickness of the metal casing or pipe is not known, both processes or manners are used and the resulting echoes/reverberations of the emitted acoustic signals are analyzed. The graph 40 of FIG. 4 shows the difference in returned acoustic signal sensitivity for a 250 kHz signal and a 500 kHz signal. As seen, the sensitivity of a 250 kHz returned (echo and/or reverberation) acoustic signal represented by curve 41 is stronger than a 500 kHz signal represented by curve 42. However, the emitted pulse length of a 250 kHz acoustic signal is larger.

Metal casing or pipe wall thickness is detected since every thickness of metal casing or pipe has a characteristic resonant frequency. For example, a metal casing or pipe of ¾" thick will have a resonant frequency of around 153 kHz, where t(sec)=[pipe thickness (¾")×2]/speed of sound in steel (5.85 mm/microsecond), and frequency=1/t. Using FFT of the returned signal one can find the frequency of any metal casing/pipe wall and thus the wall thickness.

Figure 9:
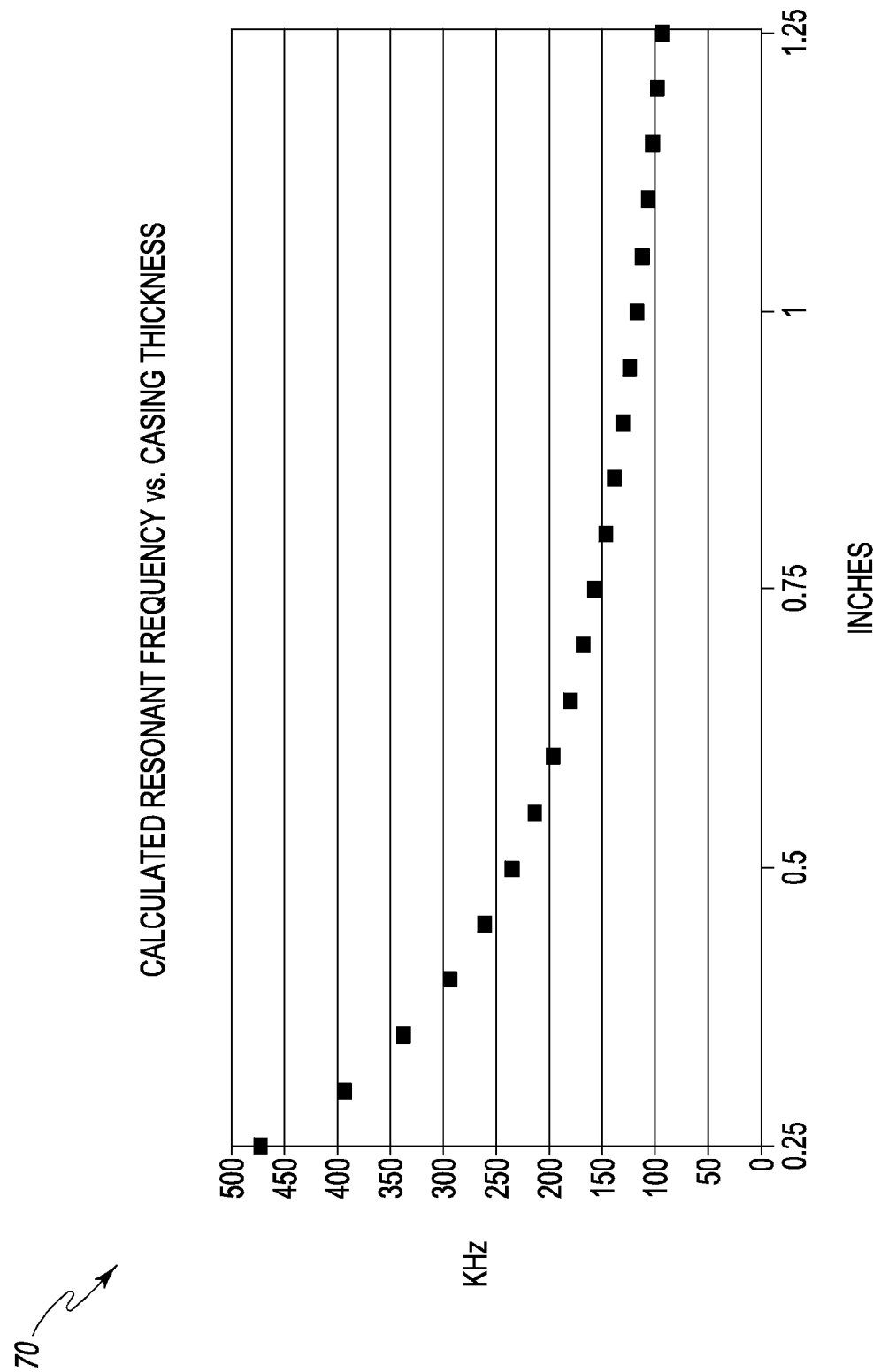
FIG. 9 is a calculated resonant frequency versus metal casing thickness graph.

Therefore, in a well integrity analysis, the integrity or thickness of the metal casing or pipe is determined by ascertaining the resonant frequency of the metal casing or pipe which indicates wall thickness as described above. The returned resonant frequency of the acoustic signal indicates wall thickness (see graph 70, FIG. 9).

In the case where the acoustic stack 12 is acoustic transmitter, there would need to be an acoustic receiver of similar construction to receive the acoustic echoes or reverberations within the 100 kHz to 750 kHz bandwidth. Additionally, while not shown, the acoustic transducer 10 is connected to appropriate electronics and/or computing in order to properly and appropriately energize the acoustic transducer for emitting an acoustic signal or signals and receive the returned acoustic signal or signals.

Figure 5:
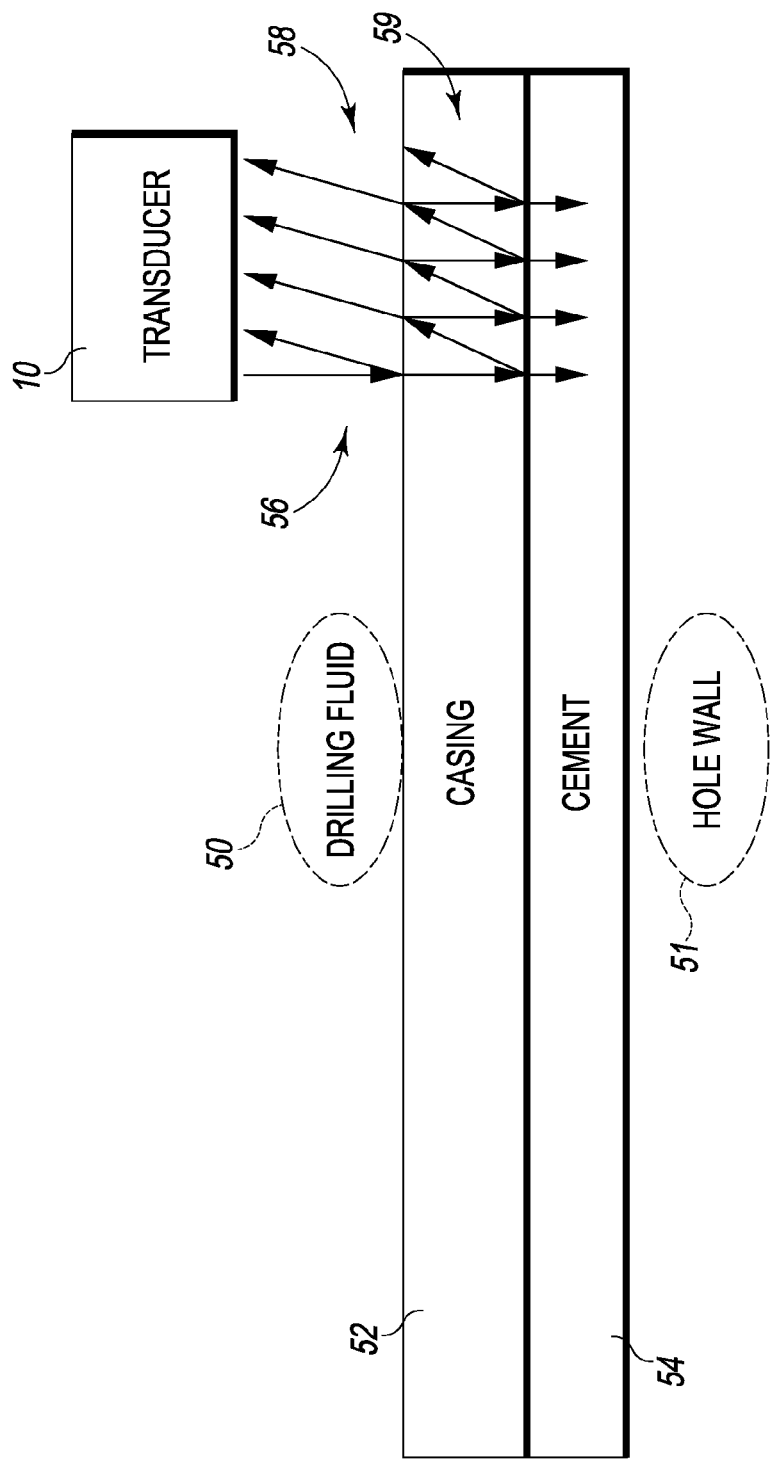
FIG. 5 is a diagram illustrating an acoustic signal emitted by the present critically damped acoustic transducer in a metal cased and cement bonded well having drilling fluid, an echoed acoustic signal from the inner diameter (ID) of the metal casing, and reverberated acoustic signals from the outer diameter (OD) of the metal casing and cement interface, the acoustic echo and the acoustic reverberation signals received by the present critically damped acoustic transducer.

Referring to FIG. 5 a diagram of the manner of analyzing metal casing thickness and cement bond quality for well integrity is shown. The acoustic transducer 10 (typically on a downhole tool, not shown) is depicted in a drilling fluid 50 of a well and in proximity to a metal casing 52 of the well. Cement 54 is shown bonded to the casing 52 with the well or hole wall 51 adjacent the cement 54.

The transducer emits a an acoustic signal or pulse 56 directed toward the metal casing 52 as represented by the left-most downward pointing arrow. An acoustic echo, represented by the left-most upward pointing arrow, is reflected from the inner diameter (ID) of the casing 52. Transmit time for the transmitting of the acoustic signal to reception of the acoustic echo is calculated. Since the original casing thickness is known for a particular depth, variations in transit time indicated variations in casing thickness. This provides internal corrosion detection.

Reverberations 58 represented by the upwardly pointing arrows adjacent to the left-most upwardly pointing arrow are emitted back from the interface between the inner diameter (ID) of the metal casing 52 and the outer diameter (OD) of the metal casing 52. The strength of the reverberations are diminished or attenuated by the cement 54 as represented by the downwardly pointing arrows adjacent the left-most downwardly point arrow. These reverberations superimpose to constructively and destructively create the acoustic reverberation signals. Over time, the resonance is going to get lower and lower—i.e. the signal strength dies off. How quickly the signal dampens determines whether there is a good cement bond to the casing. The amount of time it takes the acoustic signal to travel to and hit the casing wall then reflect back as well as the dampening of the signal indicates how good the cement is bonded to the casing. Resonance of the metal casing detects wall corrosion since the metal casing diameter should be known for a particular depth. Frequency content of the casing ID echo, the frequency content of the casing OD reverberations, and the amplitude oft eh casing OD reverberations are detected for casing thickness determination and cement bond quality.

Figure 6:
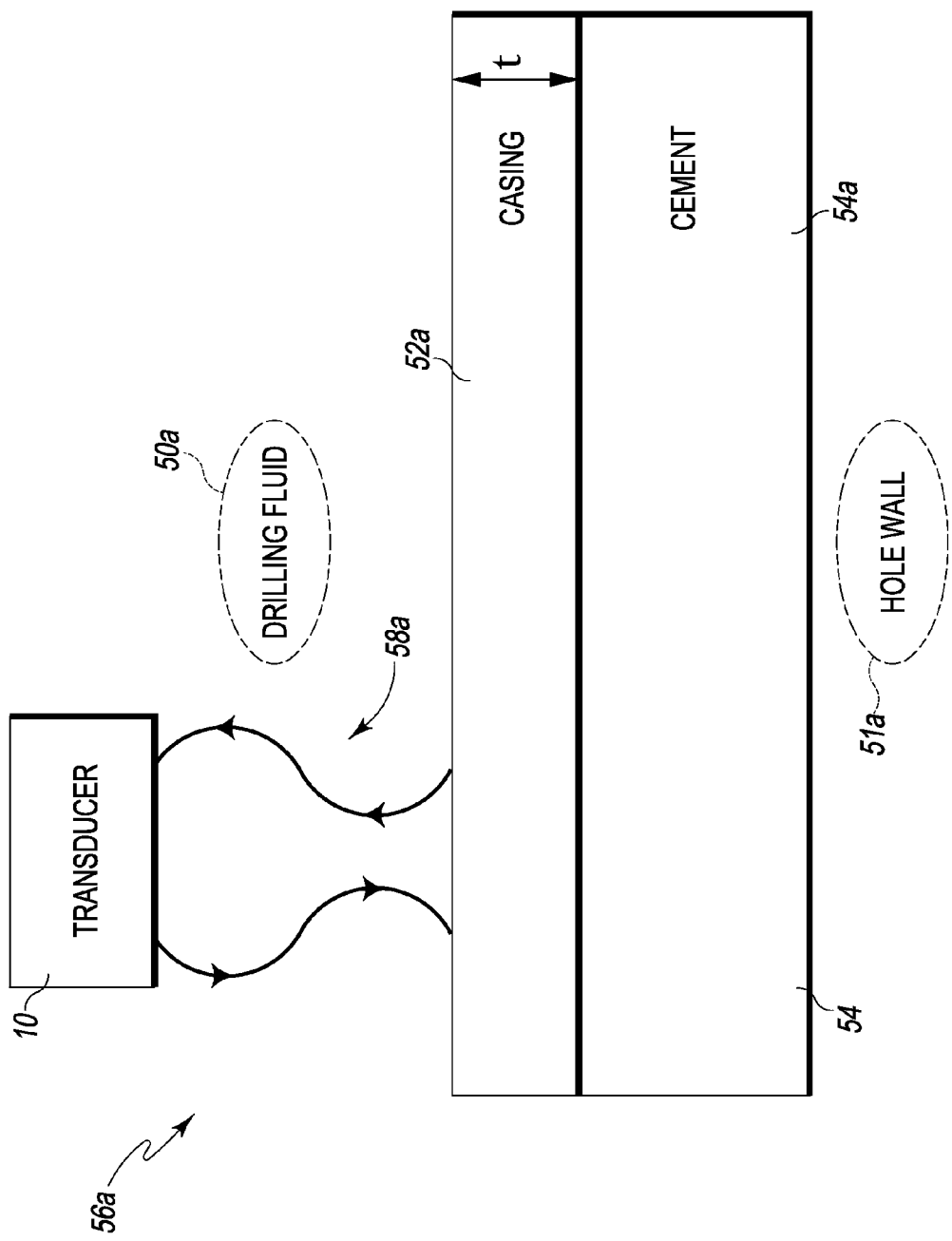
FIG. 6 is a diagram illustrating an acoustic signal emitted by the present critically damped acoustic transducer in a metal cased and cement bonded well having circulating drilling fluid and of an acoustic signal echoed from the inner diameter (ID) of the metal casing, and received by the present critically damped acoustic transducer the echoed acoustic signal having all frequency content.

Referring to FIG. 6 a diagram of the manner of analyzing metal casing thickness and cement bond quality for well integrity with circulating drilling fluid 50a is shown. The acoustic transducer (typically on a downhole tool, not shown) is depicted emitting an acoustic signal (represented by the curved, downward pointed arrow 56a) into the circulating drilling fluid 50a of a well and in proximity to a metal casing 52a of the well. Cement 54a is shown bonded to the casing 52a with the well or hole wall 51a adjacent the cement 54a. The acoustic echo (represented by the curved, upward pointed arrow 58a) from the inner diameter (ID) of the casing has a complete frequency content (noting that wavelength in the drilling fluid, casing and cement different: i.e. $\lambda_{steel} \approx 4\lambda_{fluid} \approx 2\lambda_{cement}$.

Figure 7:
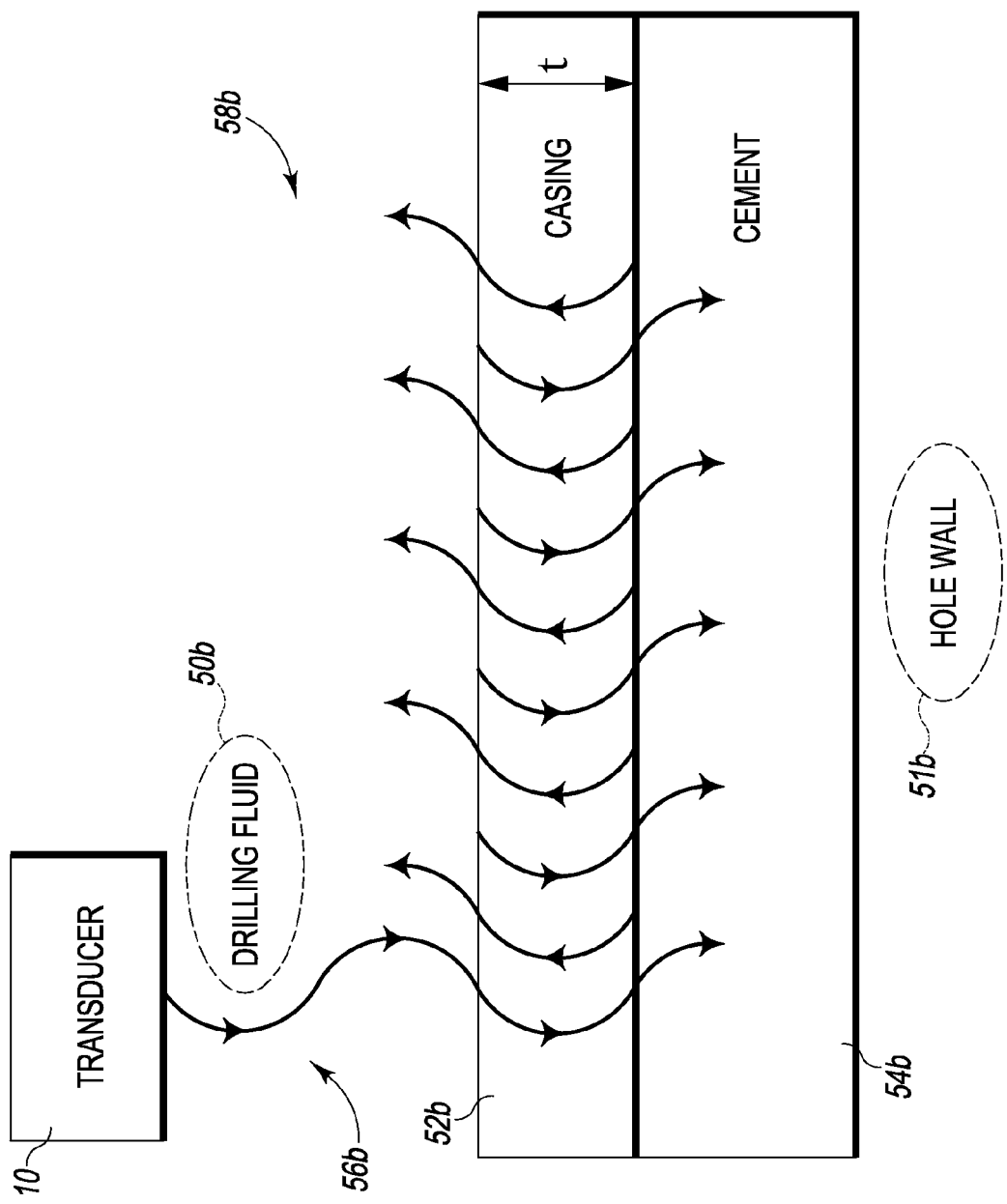
FIG. 7 is a diagram illustrating an acoustic signal emitted by the present critically damped acoustic transmitter in a metal cased and cement bonded well having circulating drilling fluid and of acoustic reverberation from the metal casing outer diameter and cement interface (OD/C interface), wherein the acoustic reverberations leave the OD/C interface in-phase to constructively add pressure to the reverberations when the thickness of the metal casing (t) is equal to one-half of the frequency of the emitted acoustic signal ($\lambda/2$)—(i.e. $t=\lambda/2$), the acoustic signals received by the present critically damped acoustic transducer.

Referring to FIG. 7 a diagram of the manner of analyzing metal casing thickness and cement bond quality for well integrity with circulating drilling fluid 50b is shown. The acoustic transducer (typically on a downhole tool, not shown) is depicted emitting an acoustic signal (represented by the curved, downward pointed arrow 56b) in the circulating drilling fluid 50b of a well and in proximity to a metal casing 52b of the well. Cement 54b is shown bonded to the casing 52b with the well or hole wall 51b adjacent the cement 54b. The acoustic reverberations from the casing/cement interface, represented by the five (5) curved upwardly pointed arrows, leave in phase and thus constructively add pressure to the acoustic reverberations when thickness (t) of the metal casing 52b equals one half of the wavelength of the emitted acoustic signal ($\lambda/2$)—(i.e. $t=\lambda/2$).

Figure 8:
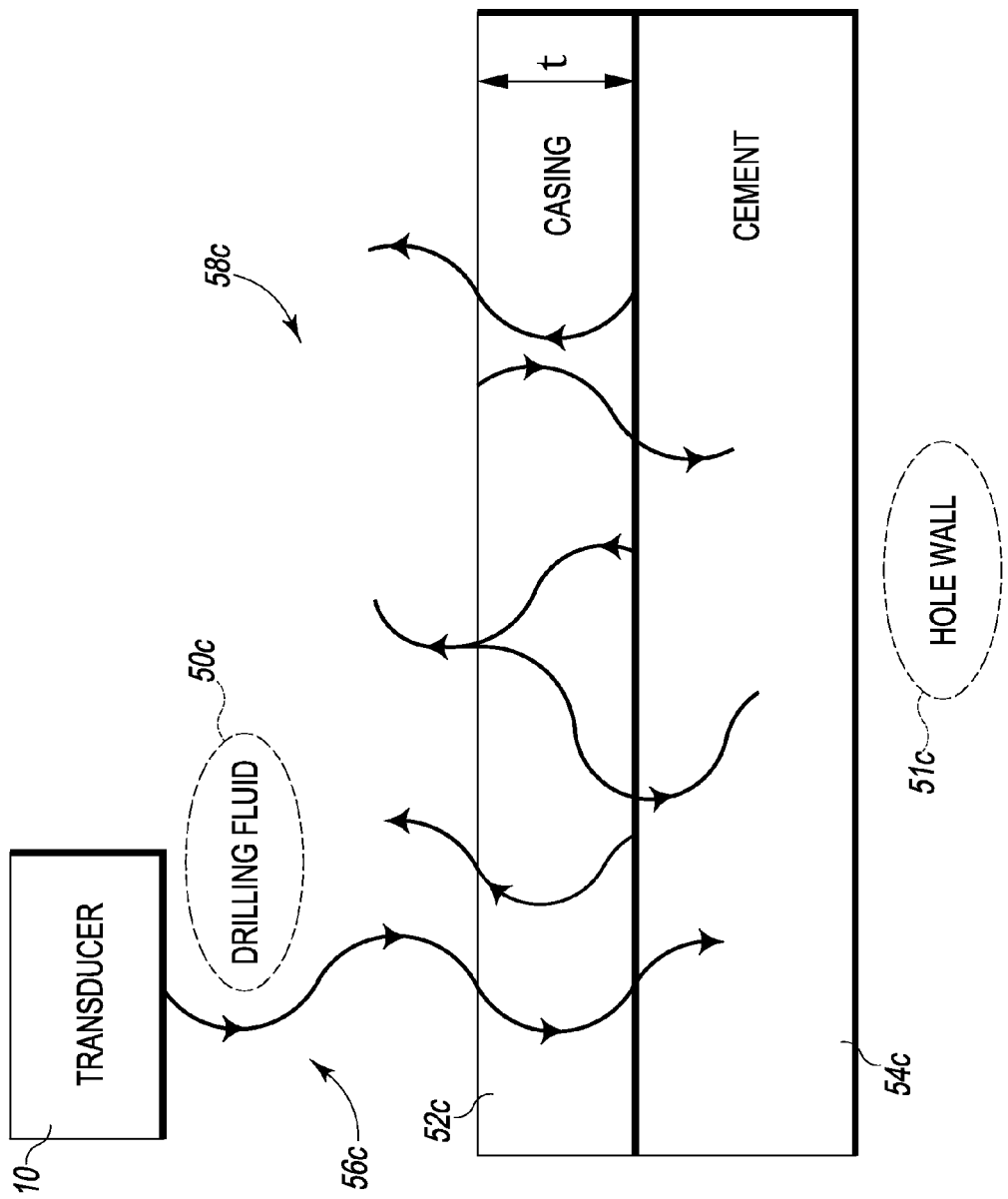
FIG. 8 is a diagram illustrating an acoustic signal emitted by the present critically damped acoustic transmitter in a metal cased and cement bonded well having circulating drilling fluid and of acoustic reverberations from the metal casing outer diameter and cement interface (OD/C interface), wherein the acoustic reverberations leave the OD/C interface out-of-phase to destructively subtract pressure from the reverberations when the thickness of the metal casing (t) is not equal to one-half the frequency of the emitted acoustic signal—i.e. $t<\lambda/2<t$), the acoustic signals received by the present critically damped acoustic transducer.

Referring to FIG. 8 a diagram of the manner of analyzing metal casing thickness and cement bond quality for well integrity with circulating drilling fluid 50c is shown. The acoustic transducer (typically on a downhole tool, not shown) is depicted emitting an acoustic signal (represented by the curved, downward pointed arrow 56c) in the circulating drilling fluid 50c of a well and in proximity to a metal casing 52c of the well. Cement 54c is shown bonded to the casing 52c with the well or hole wall 51c adjacent the cement 54c. The acoustic reverberations from the casing/cement interface, represented by the three (3) curved upwardly pointed arrows, leave out of phase, destructively interfere and thus cancel and/or subtract pressure when the thickness of the metal casing (t) is not equal to one-half the frequency of the emitted acoustic signal—i.e. $t<\lambda/2<t$).

Figure 10:
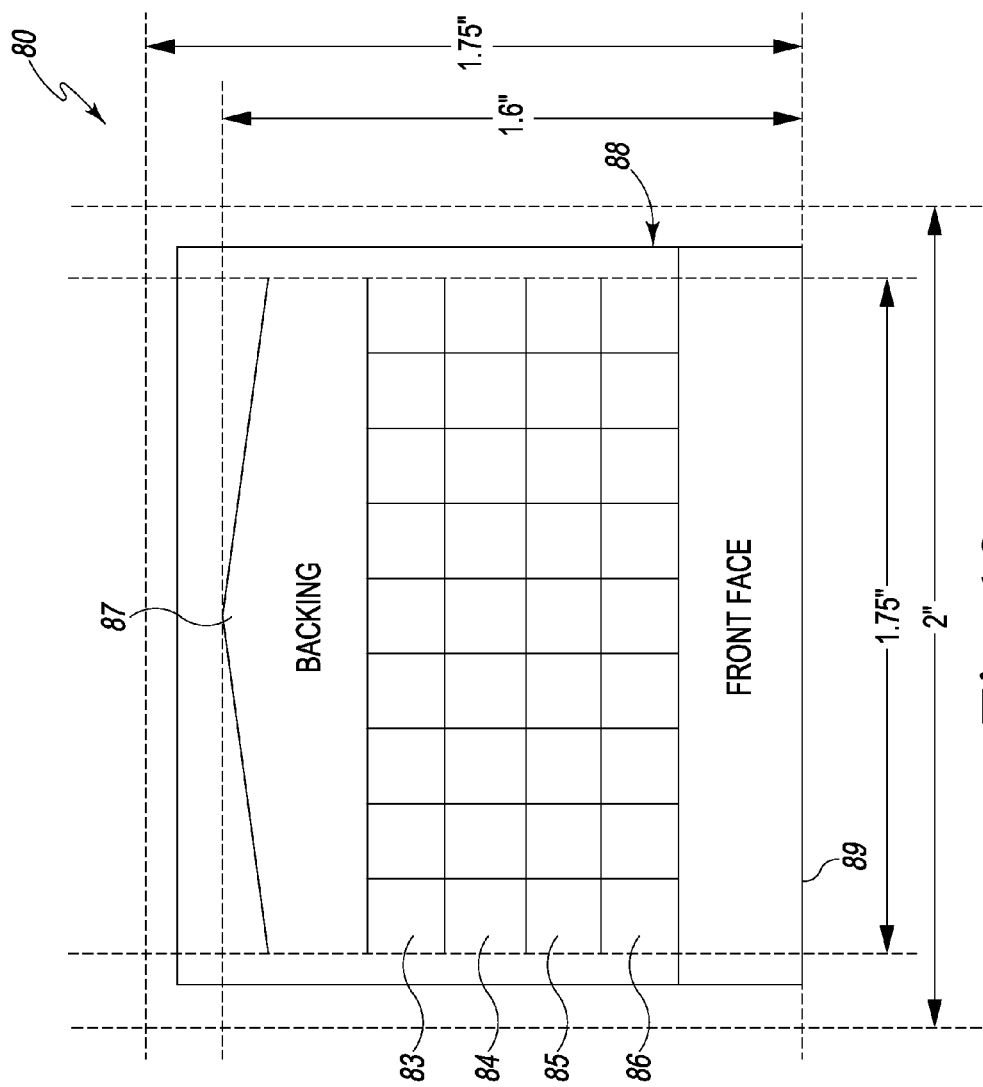
FIG. 10 is a depiction of another embodiment of a critically damped acoustic transducer according to the present principles.

Referring to FIG. 10, there is depicted another embodiment of a critically damped acoustic transducer ("acoustic transducer"), generally designated 80, fashioned in accordance with the present principles. The acoustic transducer 80 has an acoustic stack 88 having four acoustic elements 83, 84, 85, 86. The acoustic elements are preferably piezoelectric ceramics, however, other types of acoustic elements may be used. The acoustic stack 88 may be fashioned as an acoustic transducer or as only an acoustic transmitter depending on its electrical connection. Thus, description of the acoustic stack 88 and its components are applicable to the embodiment as a transducer 80 or as an acoustic transmitter except as indicated.

The acoustic elements 83, 84, 85, 86 are bonded to each while the acoustic stack 88 is mounted to a highly acoustically absorbing or attenuating backing 87 (i.e. an impedance of 15 to 25 MRyls) all of which are disposed in a housing 89. The elements are mounted to each other and a front face of the backing 87 preferably, but not necessarily, by epoxy. The backing 87 is preferably, but not necessarily, made of tungsten while the housing 89 is preferably, but not necessarily, made of PEEK. Other suitable materials however may be used for the backing 87 and the housing 89. The housing 89 is retained in a downhole tool (not shown) having an opening to receive the acoustic transducer 80 such that an acoustic signal from the acoustic stack 88 can be emitted from the bottom of the housing 89 toward a pipe casing or wall. The dimensions of a preferred embodiment are provided in the figure.

Figure 11:
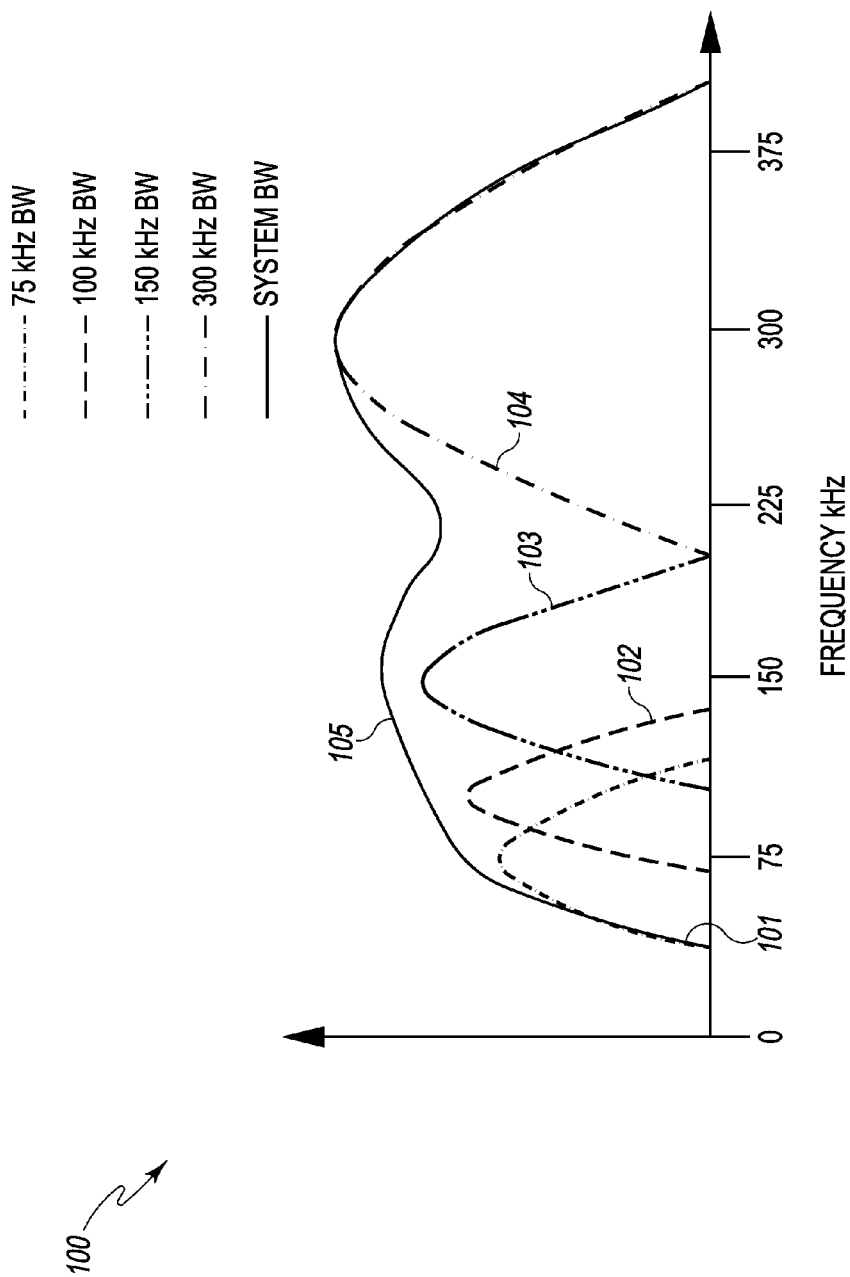
FIG. 11 is a graph showing the various frequencies achieved with the critically damped acoustic transducer of FIG. 10 when energized in its various modes according to the present principles.

FIG. 11 shows a graph wherein frequency of the four element critically damped transducer 80 of FIG. 10 wherein each element is 300 kHz and 0.2" thick. As described below, the four elements 83, 84, 85, 86 are driven to provide various bandwidths (BW). Curve 101 shows a center frequency of 75 kHz through driving/energizing all elements. Curve 102 shows a center frequency of 100 kHz through driving/energizing adjacent triplets of the elements. Curve 103 shows a center frequency of 150 kHz through driving/energizing adjacent pairs of the elements. Curve 104 shows a center frequency of 300 kHz through driving/energizing a single element. Curve 105 shows the overall bandwidth of the system when all four modes are used. Multi-element devices have three advantages for pulse-echo applications. One advantage is that driving the elements separately can increase outgoing signal content both by increasing intensity and bandwidth. Another advantage is that elements can be driven to increase negative interference at the backing or around the perimeter of the device to reduce residual noise. The third advantage is that returning signals will be heard at each element with a known time-offset allowing correlation techniques to reject sound coming from the side or back of the transducer.

Figure 12:
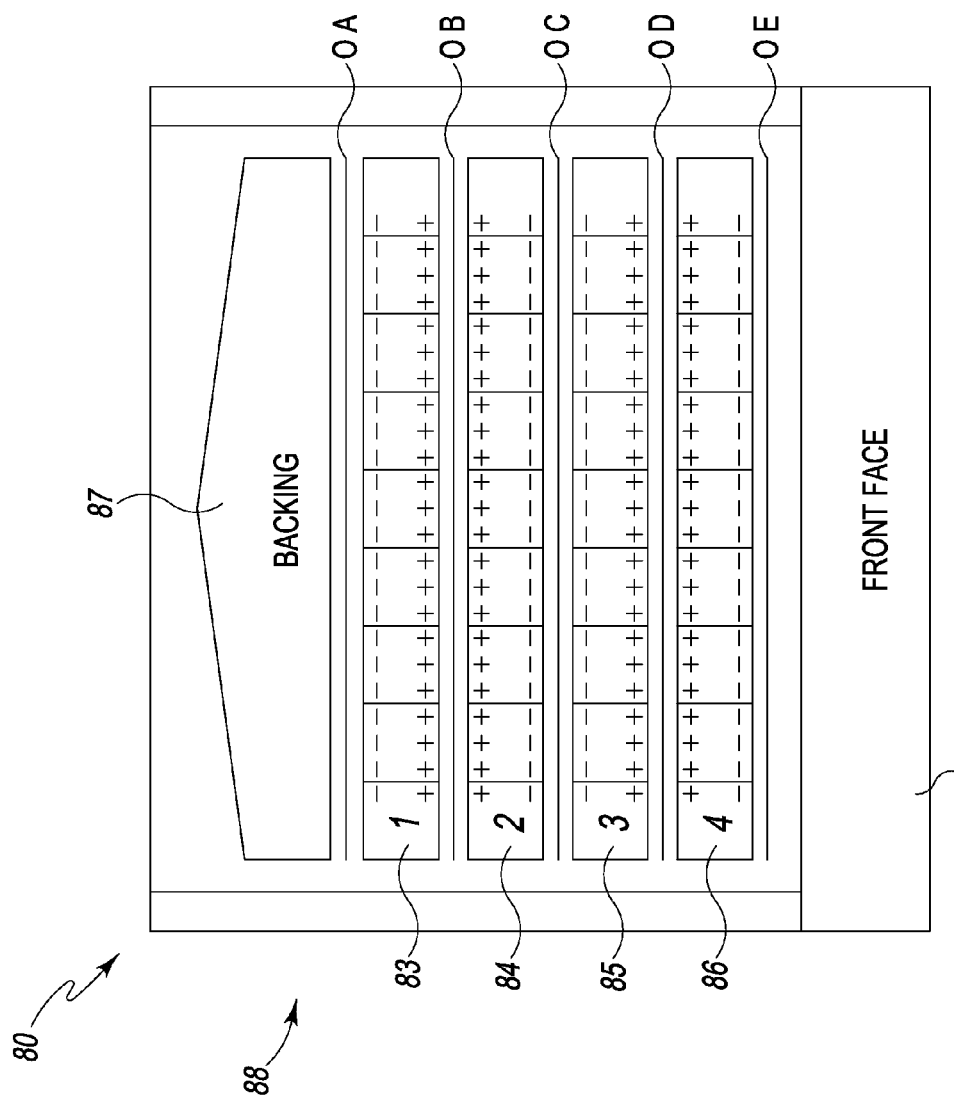
FIG. 12 is a depiction of the critically damped acoustic transducer of FIG. 10 connected to voltage sources for energizing the various acoustic elements in accordance with the present principles.

FIG. 12 shows the critically damped transducer 80 connected to one or more voltage sources for driving/energizing the elements. The four elements 83 (1), 84 (2), 85 (3), 86 (4) are pulsed by voltage applied through leads A-E. As seen in FIG. 12, the polarity of adjacent elements is reversed to minimize voltage when multiple elements are driven simultaneously.

Figure 13:
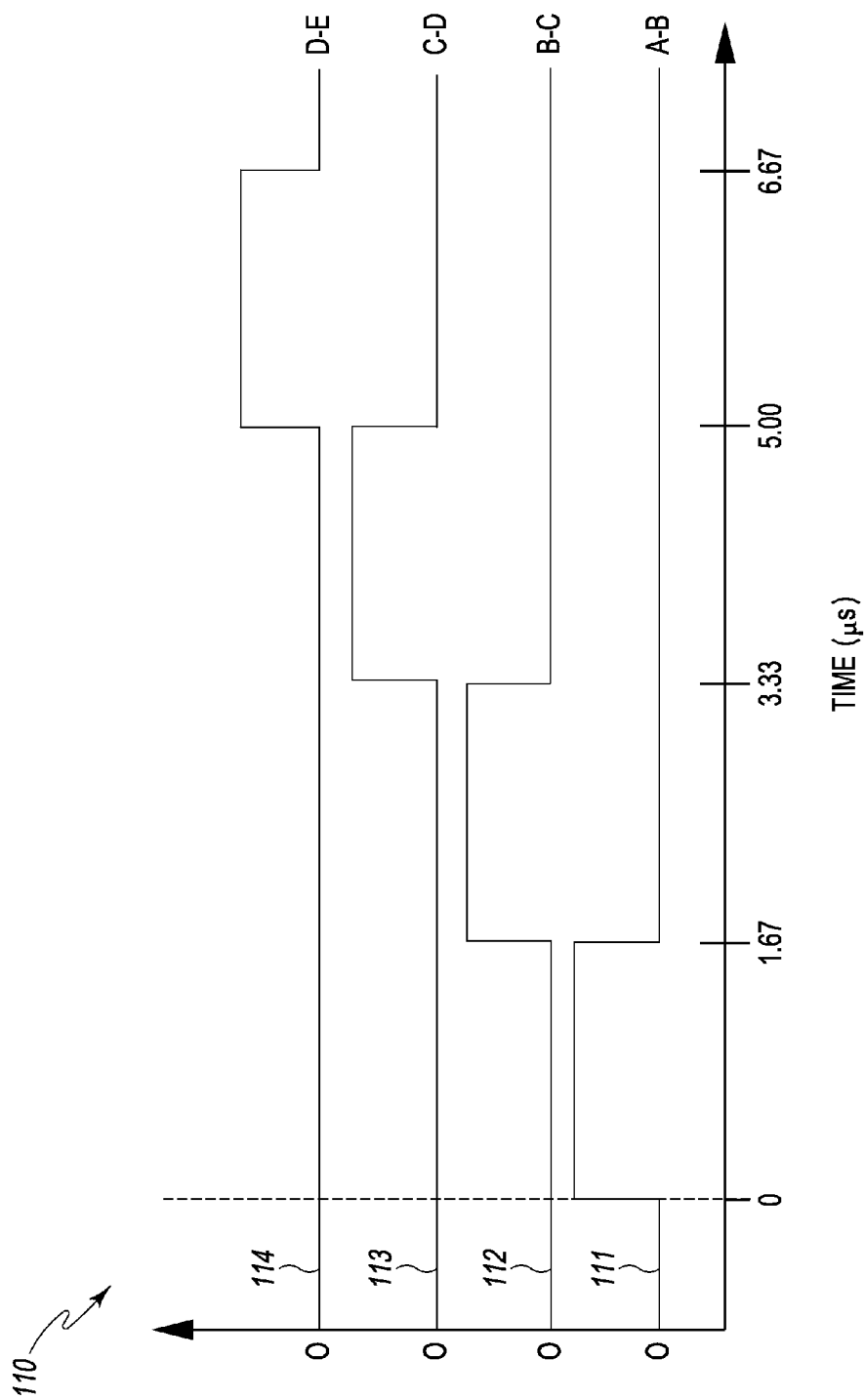
FIG. 13 is a timing chart for energizing the elements of the critically damped transducer of FIG. 12 singularly and sequentially.

FIG. 13 shows a timing chart 110 where each element is driven individually and sequentially (i.e. four element sequential). The process starts with element 83 driven at time 0 by a pulse 111. The next pulse 112 begins as sound from element 83 arrives at the front face of element 84. The third pulse 113 begins as sound from elements 83 and 84 arrive at the front face of element 85. The fourth pulse 114 begins as sound from elements 83, 84 and 85 arrive at the front face of element 86. This optimizes the high frequency content and signal to noise ratio.

Figure 14:
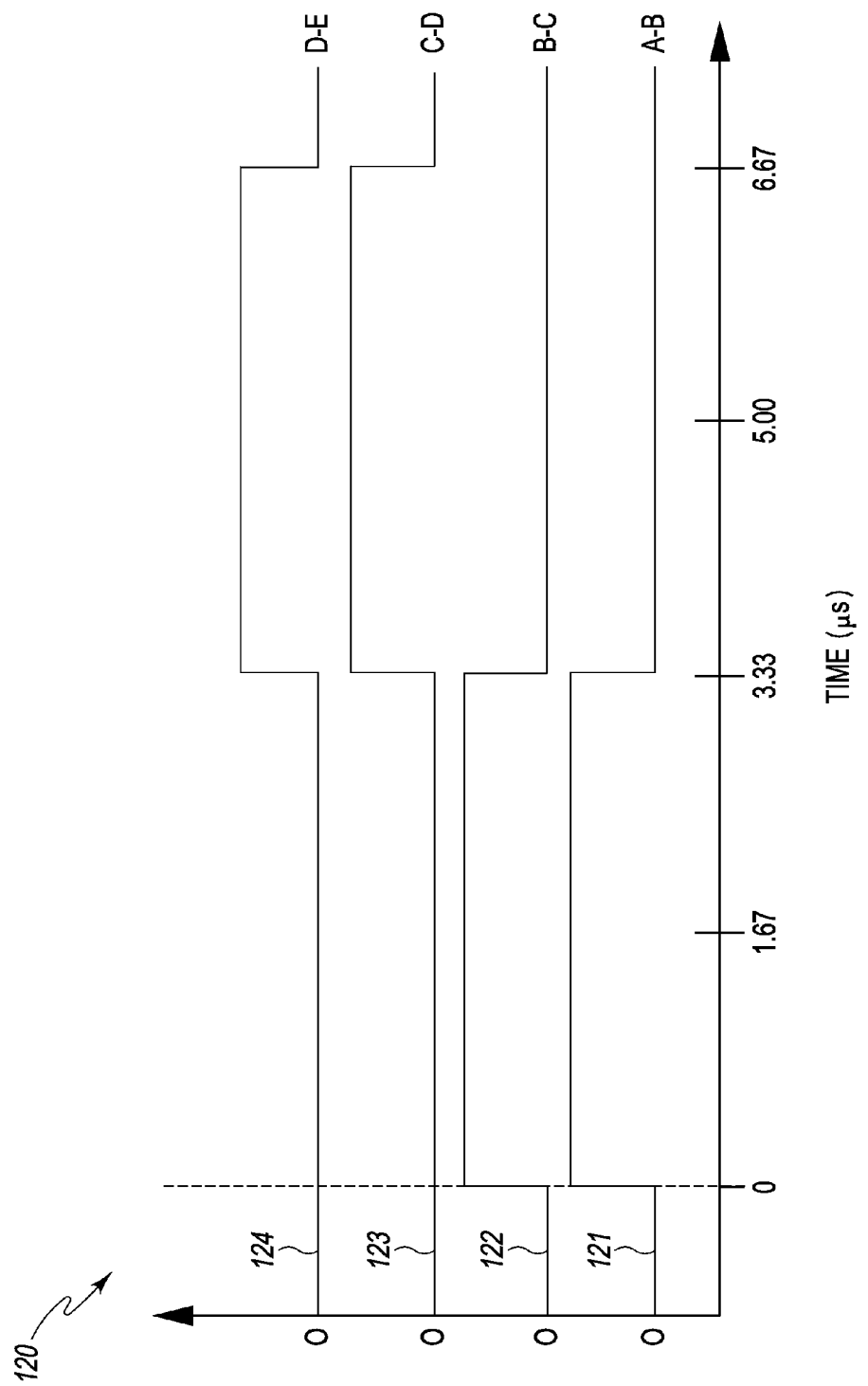
FIG. 14 is a timing chart for energizing the elements of the critically damped transducer of FIG. 12 in pairs.

FIG. 14 shows a timing chart 120 where element pairs are driven sequentially (i.e. paired element sequential). The pulses 121, 122 drive the first and second elements 83, 84 via the voltage connections as shown. The pulses 123, 124 drive the elements 85, 86 via the voltage connections as shown.

Figure 15:
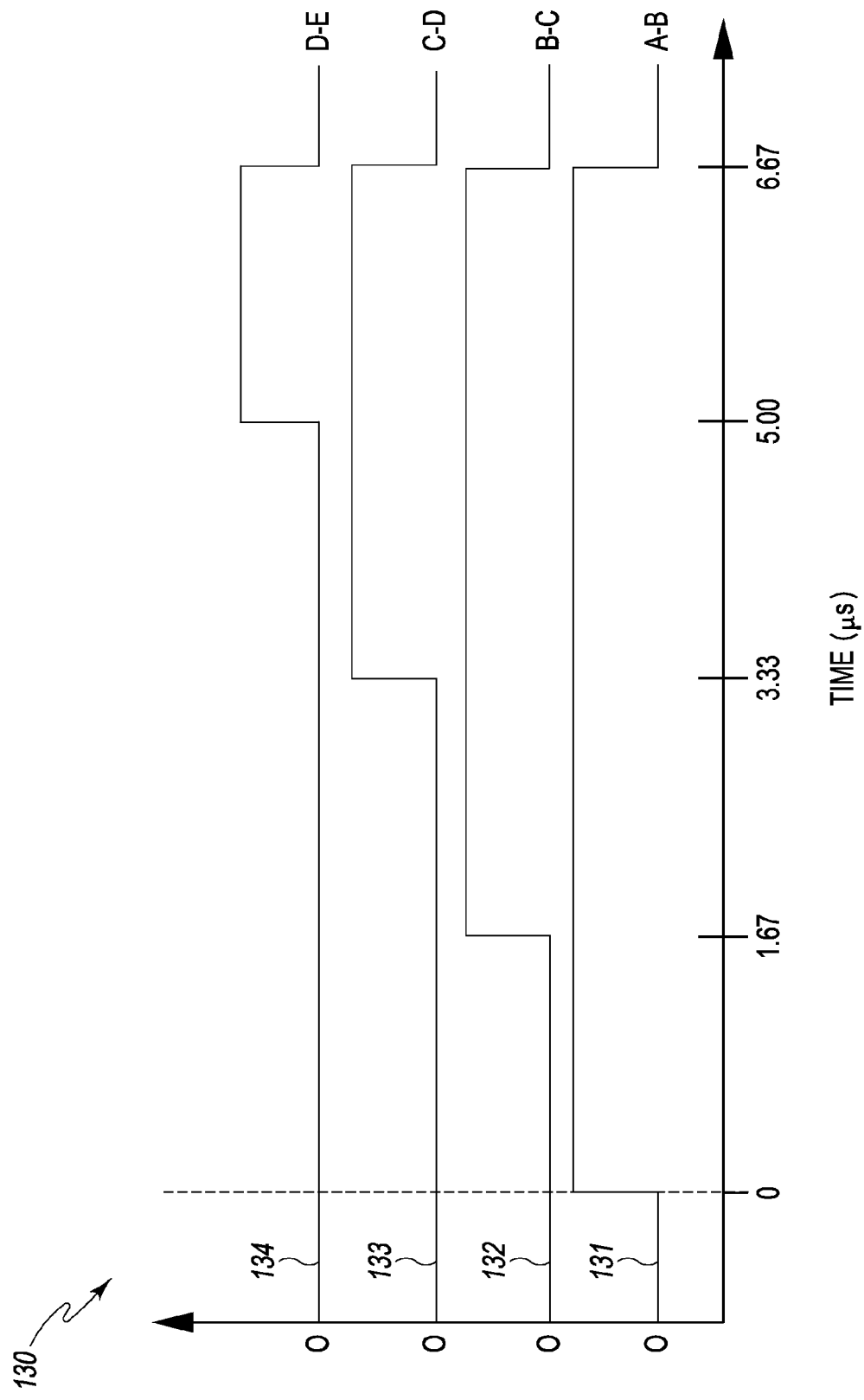
FIG. 15 is a timing chart for energizing the elements of the critically damped transducer of FIG. 12 sequentially but together.

FIG. 15 shows a timing chart 130 where elements are all driven together at the end to maximize frequency content. Thus, pulse 131 drives element 83 at time 0 and throughout. Pulse 132 then drives element 84 at a time after the beginning of the pulse 131 and throughout. Pulse 133 then drives element 85 at a time after the beginning of the pulse 132 and throughout. Pulse 134 then drives element 86 at a time after the beginning of the pulse 133 and throughout until the end.

While the present system has been described in conjunction with well integrity analysis, the present acoustic transducer can be used for non-destructive testing and/or analysis of other things such as piping of all manner and use, fluid/air flow detection and flow rate measurements both particularly within and about pipes. However, in the case of fluid or air detection/measurements, two acoustic transducers would be required.

Those of skill in the art will understand that various details of the invention may be changed without departing from the spirit and scope of the invention. Furthermore, the foregoing description is for illustration only, and not for the purpose of limitation, the invention being defined by the claims.

While the invention has been illustrated and described in detail in the foregoing drawings and description, the same is to be considered as illustrative and not restrictive in character, it being understood that only illustrative embodiments thereof have been show and described and that all changes and modifications that are within the scope of the following claims are desired to be protected.

Any and all references cited in this specification are incorporated herein by reference to the extent that they supplement, explain, provide a background for or teach methodology or techniques employed herein.

What is claimed is:

1. A method comprising:
providing an acoustic transmitter having a stacked arrangement of acoustic elements within a housing, the acoustic transmitter comprising a first acoustic element mounted to a backing and a second acoustic element mounted to the first acoustic element;
energizing the acoustic transmitters in a first manner in which the first acoustic element is energized and then the second acoustic element is energized after energizing the first acoustic element; and
energizing the acoustic transmitter in a second manner in which only one of the first and second acoustic elements is energized.

2. The method of claim 1 wherein, during the energizing of the acoustic transmitters in the first manner, the second acoustic element is energized after an acoustic signal from the first acoustic element reaches a front face of the second acoustic element.

3. The method of claim 1 wherein the acoustic transmitter is provided on a downhole tool and the acoustic transmitters are energized in the first and second manners while within a well.

4. The method of claim 3 wherein the acoustic transmitter is used to perform a well integrity measurement.

5. The method of claim 4 wherein the well integrity measurement comprises a measurement of at least one of pipe wall thickness and cement bond quality.

6. The method of claim 1 wherein the first and second acoustic elements have the same center frequency.

7. The method of claim 1 wherein the first acoustic element is energized when the acoustic transmitter is energized in the second manner.

8. The method of claim 1 wherein energizing the acoustic transmitter in the first and second manners provides a bandwidth larger than the bandwidth of the center frequency of either the first or second acoustic elements.

9. A method comprising:
providing an acoustic transmitter having a stacked arrangement of acoustic elements within a housing, the acoustic transmitter comprising a first acoustic element mounted to a backing, a second acoustic element mounted to the first acoustic element, and a common electrode disposed between the first and second acoustic elements;
energizing the acoustic transmitter in a first manner by first energizing the first acoustic element and then energizing the second acoustic element after a predetermined time delay from the energizing of the first acoustic element;
wherein the predetermined time delay corresponds to an acoustic pulse from the energizing of the first acoustic element reaching a front face of the second acoustic element that is opposite the common electrode.

10. The method of claim 9 further comprising energizing the acoustic transmitter in a second manner in which only one of the first and second acoustic elements is energized.

11. The method of claim 10 wherein energizing the acoustic transmitter in the first and second manners provides a bandwidth larger than the bandwidth of the center frequency of either the first or second acoustic elements.

12. The method of claim 10 wherein the first acoustic element is energized when the acoustic transmitter is energized in the second manner.

13. The method of claim 9 wherein the acoustic transmitter is provided on a downhole tool and the acoustic transmitters are energized in the first and second manners while within a well.

14. The method of claim 9 wherein the acoustic transmitter is used to perform a well integrity measurement.

15. The method of claim 14 wherein the well integrity measurement comprises a measurement of at least one of pipe wall thickness and cement bond quality.

16. The method of claim 9 wherein the first and second acoustic elements have the same center frequency.

* * * * *